United States Patent
Dong et al.

(10) Patent No.: US 10,770,615 B2
(45) Date of Patent: Sep. 8, 2020

(54) AL—GA—N TEMPLATE, A METHOD FOR PREPARING AL—GA—N TEMPLATE, AND SEMICONDUCTOR DEVICE COMPRISING AL—GA—N TEMPLATE

(71) Applicant: HC SEMITEK (SUZHOU) CO., LTD., Suzhou (CN)

(72) Inventors: Binzhong Dong, Suzhou (CN); Wubin Zhang, Suzhou (CN); Haiping Ai, Suzhou (CN); Peng Li, Suzhou (CN); Jiangbo Wang, Suzhou (CN)

(73) Assignee: HC SEMITEK (SUZHOU) CO., LTD., Suzhou (CN)

( * ) Notice: Subject to any disclaimer, the term of this patent is extended or adjusted under 35 U.S.C. 154(b) by 0 days.

(21) Appl. No.: 16/022,750

(22) Filed: Jun. 29, 2018

(65) Prior Publication Data
US 2018/0323337 A1 Nov. 8, 2018

Related U.S. Application Data

(63) Continuation-in-part of application No. PCT/CN2016/077757, filed on Mar. 29, 2016.

(30) Foreign Application Priority Data

Dec. 31, 2015 (CN) .......................... 2015 1 1029673

(51) Int. Cl.
*H01L 33/00* (2010.01)
*H01L 33/32* (2010.01)
*H01L 33/12* (2010.01)

(52) U.S. Cl.
CPC ........ *H01L 33/0075* (2013.01); *H01L 33/007* (2013.01); *H01L 33/32* (2013.01); *H01L 33/12* (2013.01)

(58) Field of Classification Search
CPC .... H01L 33/0075; H01L 33/007; H01L 33/32
See application file for complete search history.

(56) References Cited

U.S. PATENT DOCUMENTS

2012/0025205 A1* 2/2012 Nakata ............. H01L 21/02378
257/77

* cited by examiner

*Primary Examiner* — Thanhha S Pham
(74) *Attorney, Agent, or Firm* — Matthias Scholl P.C.; Matthias Scholl

(57) ABSTRACT

An AlGaN template including a substrate and an $Al_{1-x}Ga_xN$ crystallization thin film deposited on the substrate, where $0<x<1$. A method for preparing the AlGaN template includes providing a substrate; and depositing an $Al_{1-x}Ga_xN$ crystallization thin film on the substrate.

5 Claims, 6 Drawing Sheets ns of 1 nm-1000 nm.

AL—GA—N TEMPLATE, A METHOD FOR PREPARING AL—GA—N TEMPLATE, AND SEMICONDUCTOR DEVICE COMPRISING AL—GA—N TEMPLATE

CROSS-REFERENCE TO RELAYED APPLICATIONS

This application is a continuation-in-part of International Patent Application No. PCT/CN2016/077757 with an international filing date of Mar. 29, 2016, designating the United States, now pending, and further claims foreign priority benefits to Chinese Patent Application No. 201511029673.0 filed Dec. 31, 2015. The contents of all of the aforementioned applications, including any intervening amendments thereto, are incorporated herein by reference. Inquiries from the public to applicants or assignees concerning this document or the related applications should be directed to: Matthias Scholl P C., Attn.: Dr. Matthias Scholl Esq., 245 First Street, 18th Floor, Cambridge, Mass. 02142.

BACKGROUND

The disclosure relates to the field of semiconductor technology, and more particularly to an AlGaN template, a method for preparing the AlGaN template, and a semiconductor device comprising the AlGaN template.

At present, most of GaN-based blue light emitting diodes (LEDs) and GaN-based white LEDs use a sapphire substrate. Since sapphire and GaN materials suffer from lattice mismatch and thermal mismatch problems while there is only a small lattice mismatch between AlN materials and GaN materials and between AlN materials and sapphire substrates, AlN is used as a buffer layer between a GaN layer and a sapphire substrate. Specifically, an AlN buffer layer is first grown on a sapphire substrate to form an AlN template, and then GaN epitaxial growth is performed on the AlN template to form an LED epitaxial wafer.

The lattice constant of the AlN buffer layer is smaller than that of GaN and sapphire. Growing GaN epitaxy on the AlN template leads to greater compressive stress in the subsequent GaN epitaxy. When the quantum well structure of the GaN epitaxial growth is grown, the epitaxial wafer is in a warped state, so that the growth temperature of the quantum well structure is not uniform, and the uniformity of the wavelength of the epitaxial wafer is poor, so that epitaxial wafers cannot be mass-produced with high yield.

FIGS. 1A-1B shows a photoluminescence (PL) wavelength mapping map of an LED epitaxial wafer based on a 4-inch AlN template. As can be seen from FIGS. 1A-1B, the edge wavelength of the epitaxial wafer (point A) is 458 nm, and the center wavelength of the epitaxial (point B) is 468 nm. The wavelength difference between the center and the edge is up to 10 nm, and the standard deviation of the wavelength of the entire epitaxial wafer is 4.18 nm. The qualified epitaxial wafers require a standard deviation of the wavelength of 2 nm. Therefore, the epitaxial wafer does not meet the qualification requirements.

SUMMARY

The disclosure provides an AlGaN template, a method for preparing the AlGaN template, and a semiconductor device comprising the AlGaN template.

Disclosed is an AlGaN template comprising a substrate and an $Al_{1-x}Ga_xN$ crystallization thin film deposited on the substrate, where $0<x<1$.

The $Al_{1-x}Ga_xN$ crystallization thin film can have a thickness of 1 nm-1000 nm.

The $Al_{1-x}Ga_xN$ crystallization thin film can comprise a first AlGaN layer deposited on the substrate, and the first AlGaN layer can be doped with O.

The content of oxygen in the first AlGaN layer gradually can decrease or gradually increase from the interface between the substrate and the first AlGaN layer to the surface of the first AlGaN layer.

The $Al_{1-x}Ga_xN$ crystallization thin film can further comprise a second AlGaN layer deposited on the first AlGaN layer, the second AlGaN layer can be doped with oxygen and the oxygen doped in the second AlGaN layer can be uniformly distributed in the second AlGaN layer, and the thickness of the second AlGaN layer can be greater than 1 nm.

Also disclosed is a semiconductor device comprising an AlGaN template and a nitride semiconductor layer deposited on the $Al_{1-x}Ga_xN$ crystallization thin film of the AlGaN template.

A preparation method of the AlGaN template comprises:
providing a substrate; and
depositing an $Al_{1-x}Ga_xN$ crystallization thin film on the substrate, where $0<x<1$.

Depositing an $Al_{1-x}Ga_xN$ crystallization thin film on the substrate, can comprise:
arranging the substrate in a vacuum environment and baking the substrate, the baking time is 1-15 minutes, the baking temperature is 300-900 degrees Celsius, and the baking pressure is less than $10^{-7}$ Torr;
after baking, sputtering an aluminum-germanium alloy target in a gas atmosphere in which at least Ar and $N_2$ are mixed to deposit an $Al_{1-x}Ga_xN$ crystallization thin film on the substrate, the deposition temperature is 400-800 degrees Celsius, the deposition pressure is 1-10 mTorr, the sputtering power is 1 kW-10 kW, and the sputtering time is 10 seconds-1000 seconds.

Depositing an $Al_{1-x}Ga_xN$ crystallization thin film on the substrate, can comprise:
disposing the substrate into a nitrogen atmosphere or a nitrogen ion beam stream; and
vaporizing an Al source and a Ga source by an electron beam in the nitrogen atmosphere or the nitrogen ion beam to deposit the $Al_{1-x}Ga_xN$ crystallization thin film on the substrate, the deposition pressure is $2\times10^{-5}$-$7\times10^{-5}$ Torr, the deposition temperature is 100-400 degrees Celsius, and the deposition time is 10 seconds-1000 seconds.

Advantages of the AlGaN template and preparation method thereof of the disclosure are summarized as follows.

The AlGaN template is formed by depositing an $Al_{1-x}Ga_xN$ crystallization thin film on the substrate. When growing the GaN epitaxy on the AlGaN template subsequently, compared to growing GaN epitaxy on an AlN template, the addition of appropriate amount of Ga atoms do not significantly affect the crystal quality of the GaN epitaxial grown on the AlGaN template, because the Ga atom and the Al atom belong to the same group of semiconductors. Since the Ga atom radius is larger than that of Al atoms, the AlGaN template doped with Ga atom has a lattice constant that is closer to that of the subsequent GaN epitaxial layer than the AlN template. Therefore, using the AlGaN template to grow GaN epitaxy can relieve the compressive stress in the GaN epitaxial layer and improve the warpage of the epitaxial wafer when the quantum well is grown. At the same time, since the crystallization temperature of GaN materials is lower than that of AlN materials, the appropriate Ga in the AlN template is beneficial to improve the crystal quality of the template, thereby improving the crystal quality of the subsequent GaN epitaxial material. In this way, the AlGaN template reduces the accumulated stress in the GaN epitaxial layer, optimizes the wavelength uniformity of the LED epitaxy, and provides a feasibility of mass production of the epitaxial wafer on the AlGaN template while maintaining or even improving the crystal quality of the subsequent GaN epitaxy.

DETAILED DESCRIPTION

To further illustrate, experiments detailing an AlGaN template and a method of preparing the same are described below. It should be noted that the following examples are intended to describe and not to limit the description.

Figure 1A:
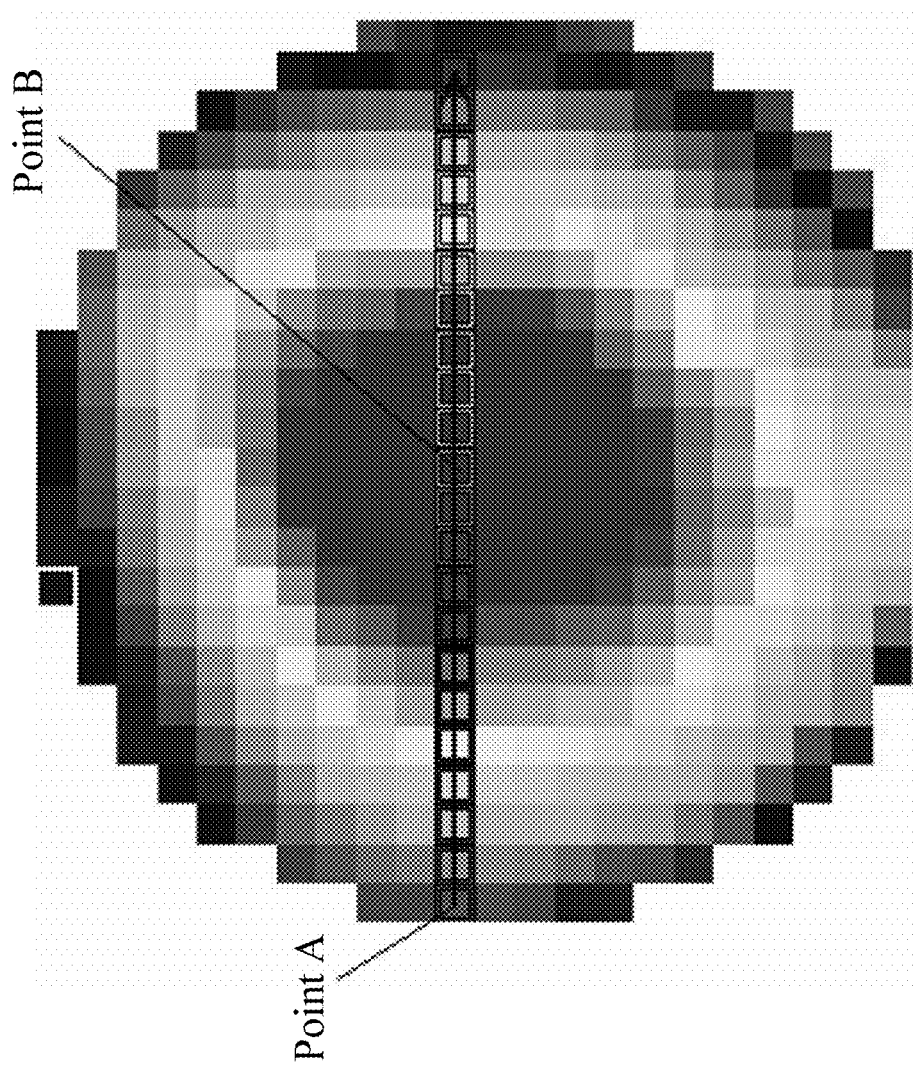
FIGS. 1A-1B illustrate a PL wavelength mapping diagram of an LED epitaxial wafer prepared based on an existing 4-inch AlN template.
Figure 1B:
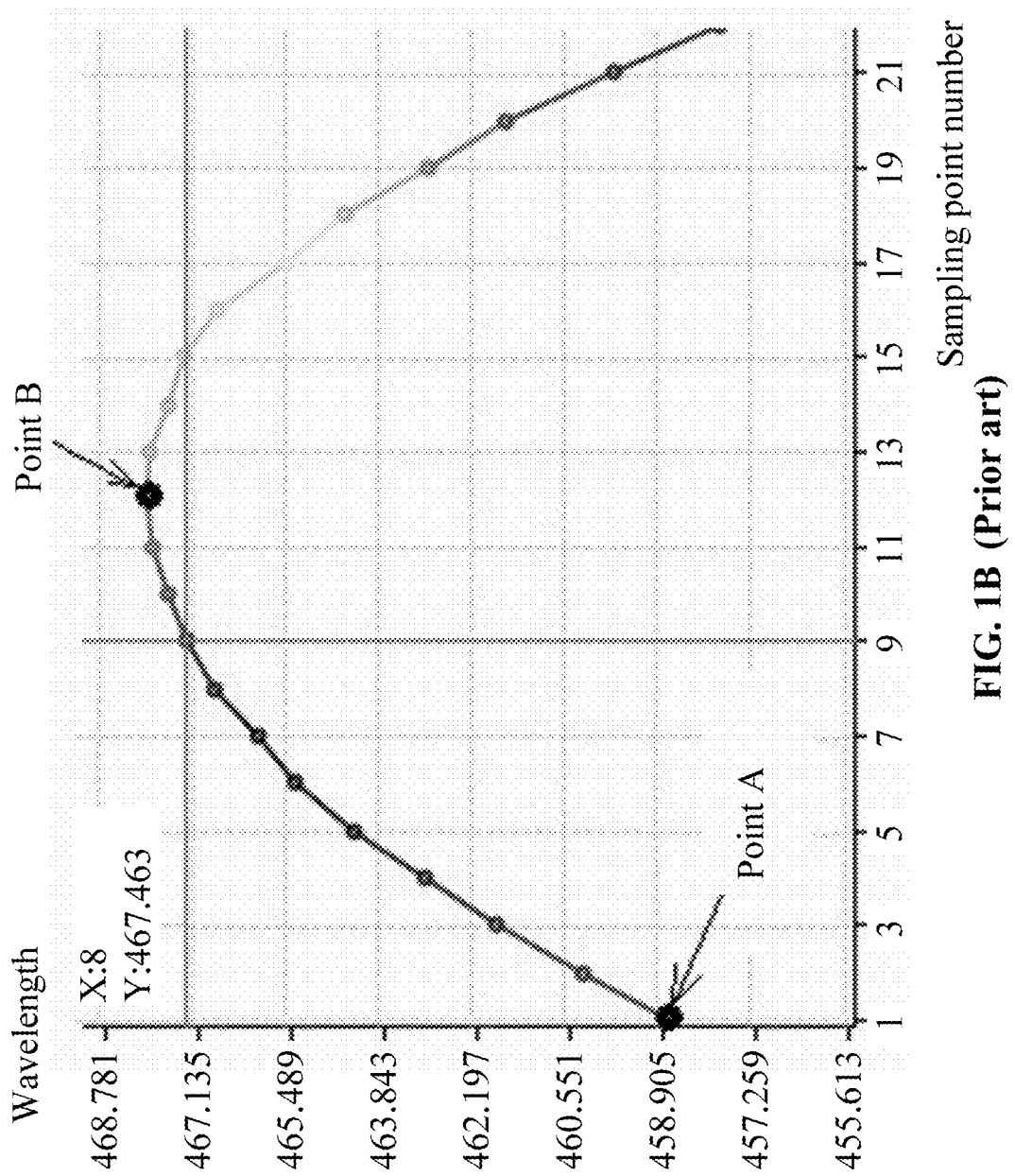
Figure 2:
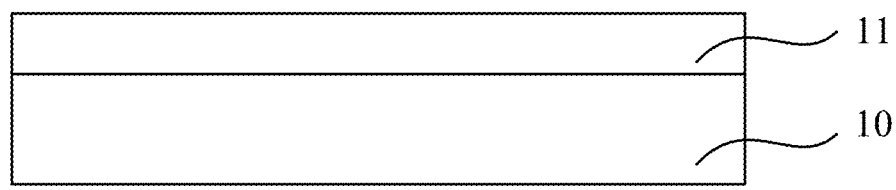
FIG. 2 is a schematic structural view of an AlGaN template according to a first embodiment of the disclosure.

FIG. 2 shows an AlGaN template provided by a first embodiment of the disclosure. As shown in FIG. 2, the AlGaN template comprises a substrate 10 and an $Al_{1-x}Ga_xN$ crystallization thin film 11 deposited on the substrate 10, $0<x<1$.

In the embodiment, the type of the substrate 10 is not limited. The substrate 10 may be a Si, SiC, sapphire, ZnO, GaAs, GaP, MgO, Cu, W, or $SiO_2$ substrate.

In implementation, the $Al_{1-x}Ga_xN$ crystallization thin film 11 may be deposited on the substrate by a Physical Vapor Deposition (PVD) process or an electron beam evaporation process. When the $Al_{1-x}Ga_xN$ crystallization thin film 11 is deposited on the substrate 10 using a PVD process, Al and Ga in the $Al_{1-x}Ga_xN$ crystallization thin film 11 are derived from an aluminum germanium alloy target. When the $Al_{1-x}Ga_xN$ crystallization thin film 11 is deposited on the substrate 10 by the electron beam evaporation process, Al and Ga in the $Al_{1-x}Ga_xN$ crystallization thin film 11 are derived from an aluminum germanium alloy, or a metallic aluminum source and a metallic germanium source. And the metallic aluminum source and the metallic germanium source may be located in separate crucibles.

The thickness of the $Al_{1-x}Ga_xN$ crystallization thin film 11 may be 1 nm to 1000 nm.

In implementation, the AlGaN template is suitable for growing GaN epitaxy, for example to prepare a GaN-based LED.

The AlGaN template is formed by depositing an $Al_{1-x}Ga_xN$ crystallization thin film on the substrate. When growing the GaN epitaxy on the AlGaN template subsequently, compared to growing GaN epitaxy on an AlN template, the addition of appropriate amount of Ga atoms do not significantly affect the crystal quality of the GaN epitaxial grown on the AlGaN template, because the Ga atom and the Al atom belong to the same group of semiconductors. Since the Ga atom radius is larger than that of Al atoms, the AlGaN template doped with Ga atom has a lattice constant that is closer to that of the subsequent GaN epitaxial layer than the AlN template. Therefore, using the AlGaN template to grow GaN epitaxy can relieve the compressive stress in the GaN epitaxial layer and improve the warpage of the epitaxial wafer when the quantum well is grown. At the same time, since the crystallization temperature of GaN materials is lower than that of AlN materials, the appropriate Ga in the AlN template is beneficial to improve the crystal quality of the template, thereby improving the crystal quality of the subsequent GaN epitaxial material. In this way, the AlGaN template reduces the accumulated stress in the GaN epitaxial layer, optimizes the wavelength uniformity of the LED epitaxy, and provides a feasibility of mass production of the epitaxial wafer on the AlGaN template while maintaining or even improving the crystal quality of the subsequent GaN epitaxy.

Figure 3:
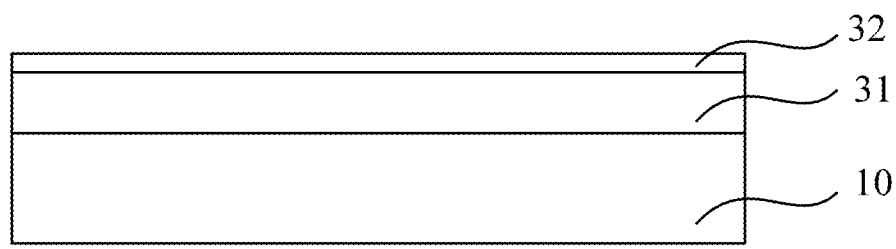
FIG. 3 is a schematic structural view of an AlGaN template according to a second embodiment of the disclosure.

FIG. 3 shows an AlGaN template provided by a second embodiment of the disclosure. In the present embodiment, the $Al_{1-x}Ga_xN$ crystallization thin film 11 described in the first embodiment will be described in detail. For the content of the present embodiment that is the same as or similar to that of the first embodiment, please refer to the first embodiment.

As shown in FIG. 3, the $Al_{1-x}Ga_xN$ crystallization thin film 11 comprises a first AlGaN layer 31 deposited on the substrate. The first AlGaN layer 31 is doped with oxygen (O).

The oxygen doped in the first AlGaN layer 31 may be derived from oxygen or an oxygen-containing gas incorporated during the deposition of the first AlGaN layer 31. The oxygen-containing gas comprises, but is not limited to, hydrogen oxide ($H_2O$), carbon monoxide (CO), carbon dioxide ($CO_2$), nitrous oxide ($N_2O$), nitric oxide (NO), nitrogen dioxide ($NO_2$), dinitrogen trioxide ($N_2O_3$), nitrous oxide ($N_2O_4$) and nitrous oxide ($N_2O_5$).

A part of the O atoms doped in the first AlGaN layer 31 will replace the N atoms in AlGaN, and the other part of the O atoms doped in the first AlGaN layer 31 will become interstitral atoms. Since the radius of O atom is larger than that of N atom, the substitutional O atoms and interstitial O atoms will cause a certain distortion of the AlGaN crystal lattice and increase the lattice constant of $Al_{1-x}Ga_xN$ film. This will make the lattice constants of the $Al_{1-x}Ga_xN$ film and the subsequent GaN epitaxial film closer, which is advantageous for reducing the compressive stress in the GaN material when growing GaN epitaxy on the AlGaN template, and improving the warpage of the epitaxial wafer when growing the quantum well, thereby improving the wavelength uniformity of the epitaxial layer on the AlGaN template. At the same time, the adoption of appropriate amount of oxygen can also improve the oxidation resistance of the AlGaN template, improve the stability of the AlGaN template under exposure to air or long-term storage in the air, and in turn, improve the stability and consistency of the characteristics of the semiconductor epitaxial materials on the AlGaN template.

In the embodiment, oxygen may be uniformly distributed in the first AlGaN layer 31. For example, the content of oxygen in the first AlGaN layer 31 is constant from the interface between the substrate 10 and the first AlGaN layer 31 to the surface of the first AlGaN layer 31. Oxygen may also be unevenly distributed in the first AlGaN layer 31. For example, from the interface between the substrate 10 and the first AlGaN layer 31 to the surface of the first AlGaN layer 31, the content of oxygen in the first AlGaN layer 31 may gradually decrease, or the content of oxygen in the first AlGaN layer 31 may gradually increase, or the content of oxygen in the first AlGaN layer 31 may gradually changes (increase or decrease) first, and then fixed and finally changes gradually.

Preferably, the content of oxygen doped in the first AlGaN layer 31 gradually decreases or gradually increases from the interface between the substrate 10 and the first AlGaN layer 31 to the surface of the first AlGaN layer 31.

In addition, when the substrate 10 is a sapphire substrate, the gradual reduction of doping oxygen in the first AlGaN layer 31 is also beneficial to reduce the defects at the interface between the sapphire substrate ($Al_2O_3$) and the $Al_{1-x}Ga_xN$ crystallization thin film 11 and increase the bonding force of the interface. When the substrate 10 is a sapphire substrate, if the doping oxygen in the first AlGaN layer 31 gradually increases, the AlGaN template prepared has the highest oxygen content on the surface, which can improve the anti-oxidation capability of the AlGaN template for long-term storage, and improve the stability and consistency of AlGaN templates in mass production.

Taking the oxygen content increasing gradually as an example, the change manner of the oxygen content will be introduced. From the interface between the first AlGaN layer 31 and the substrate 10 to the surface of the first AlGaN layer 31, the content of oxygen in the first AlGaN layer 31 may increase in a continuously changing manner, or may increase in an interval changing manner, or may increase in a manner that combines the continuously changing manner and the interval changing manner.

In implementation, the flow rate of the oxygen gas or the oxygen-containing gas incorporated may be controlled to increase over time during the film formation of the first AlGaN layer 31, such as linearly increasing over time. In this way, the content of oxygen in the first AlGaN layer 31 increases continuously. Similarly, during the film formation of the first AlGaN layer 31, the flow rate of the oxygen gas or the oxygen-containing gas incorporated may be increased at regular intervals. In this way, the content of oxygen in the first AlGaN layer 31 increases at intervals. Similarly, during the film forming process of the first AlGaN layer 31, the flow rate of the oxygen or oxygen-containing gas incorporated may be controlled to increase over time during a period of time, and the flow rate of the incorporated oxygen or oxygen-containing gas incorporated may be increased at regular intervals during another period of time. In this way, the content of oxygen in the first AlGaN layer 31 increases in such a manner that continuous change and interval change are combined.

Experiments show that the excessive addition of O in the AlGaN layer will cause the crystal quality of the AlGaN layer to decrease, which will affect the crystal quality of the subsequent GaN epitaxial film, and cannot reflect the advantage of superior crystal quality of the AlGaN template. The content of oxygen in the first AlGaN layer 31 is gradually increased or gradually decreased from the interface between the first AlGaN layer 31 and the substrate 10 to the surface of the first AlGaN layer 31 such that a part of the first AlGaN layer 31 contains less amount of oxygen which can make the first AlGaN layer 31 have a better crystal quality, thereby reflecting the advantage of superior crystal quality of the GaN epitaxial film on the AlGaN template. The other part of the first AlGaN layer 31 contains more amount of oxygen, which will make the lattice constant of the first AlGaN layer 31 closer to the subsequent GaN epitaxial film, and reduce the compressive stress in the subsequent GaN epitaxial film, thereby improving the wavelength uniformity of the LED epitaxial wafer.

Here, the content of oxygen in the first AlGaN layer 31 may be 1 to 10% of the nitrogen content in the first AlGaN layer 31. Preferably, the content of oxygen may be 2% of the nitrogen content in the first AlGaN layer 31.

It can be flexibly matched and complemented with the subsequent GaN epitaxial growth process by controlling the content of oxygen and the changing manner of the content of oxygen in the first AlGaN layer 31 such that a better wavelength uniformity of the LED epitaxial wafers prepared with different GaN epitaxial growth processes can be achieved.

As an alternative embodiment, the first AlGaN layer 31 is formed by stacking several AlGaN sublayers. From the interface between the first AlGaN layer 31 and the substrate 10 to the surface of the first AlGaN layer 31, the content of oxygen is increased layer by layer or reduced layer by layer in the AlGaN sublayers.

In the embodiment, oxygen in a single AlGaN sublayer is uniformly distributed, or unevenly distributed. If the content of oxygen in a single AlGaN sublayer is constant from the interface between the first AlGaN layer 31 and the substrate 10 to the surface of the first AlGaN layer 31, the oxygen in the single AlGaN sublayer is uniformly distributed. At this time, the content of oxygen in the first AlGaN layer 31 increases at intervals. If the content of oxygen in a single AlGaN sublayer is gradually changing (such as increasing) from the interface of the first AlGaN layer 31 and the substrate 10 to the surface of the first AlGaN layer 31, the oxygen in the single AlGaN sublayer is unevenly distributed. At this time, the content of oxygen in the first AlGaN layer 31 changes in a continuously changing manner. If from the interface between the first AlGaN layer 31 and the substrate 10 to the surface of the first AlGaN layer 31, the content of oxygen in a portion of the AlGaN sublayers is constant, and in another portion of the AlGaN sublayers is gradually increased or decreased, the content of oxygen in the first AlGaN layer 31 is changed in such a manner that the continuous change and the interval change are combined.

In the embodiment, the thicknesses of any two AlGaN sublayers may be the same or different.

Optionally, the number of AlGaN sub-layers is 1 to 50, and the thickness of the AlGaN sub-layer is 1 to 10 nm.

Preferably, the number of AlGaN sublayers is 5 to 10, and the thickness of the AlGaN sublayer is 2 to 5 nm.

As a preferred embodiment, the oxygen in a single AlGaN sublayer is uniformly distributed. When the oxygen in a single AlGaN sublayer is uniformly distributed, each AlGaN sublayer will have a certain thickness. Each layer preferably has a thickness of 1 to 10 nm, more preferably 2 to 5 nm. The oxygen-doped AlGaN sublayer with a certain thickness will allow the $Al_{1-x}Ga_xN$ film to have sufficient time and thickness to release the stress caused by the oxygen atoms, and at the same time achieves a better crystal quality of the $Al_{1-x}Ga_xN$ crystallization thin film.

Alternatively, referring again to FIG. 3, the $Al_{1-x}Ga_xN$ crystallization thin film further comprises a second AlGaN layer 32 deposited on the first AlGaN layer 31. The second AlGaN layer 32 is also doped with oxygen and the oxygen doped in the second AlGaN layer 32 is uniformly distributed in the second AlGaN layer 32. A thickness of the second AlGaN layer 32 is greater than 1 nm.

From the interface of the first AlGaN layer 31 and the second AlGaN layer 32 to the surface of the second AlGaN layer 32, the content of oxygen doped in the second AlGaN layer 32 is fixed.

Specifically, similar to the first AlGaN layer 31, the oxygen doped in the second AlGaN layer 32 may also be derived from oxygen or an oxygen-containing gas that is incorporated during the deposition of the second AlGaN layer 32.

Optionally, the content of oxygen gradually increases or decreases from the first AlGaN layer 31 to the second AlGaN layer 32.

Preferably, the second AlGaN layer 32 has a thickness of 3 nm to 5 nm.

The second AlGaN layer 32 having a thickness of more than 1 nm is formed as the surface layer of the $Al_{1-x}Ga_xN$ crystallization thin film, and the oxygen is evenly distributed in the second AlGaN layer 32, such that the stress state of the surface layer of the AlGaN template can be maintained as stable and consistent as possible. It ensures that the stress of AlGaN templates produced from different batches is stable and controllable, and is conducive to the stabilization of stress in the subsequent GaN epitaxial layers in batch production, thereby maximizing the stable control of wavelength uniformity in batch growth.

Figure 4:
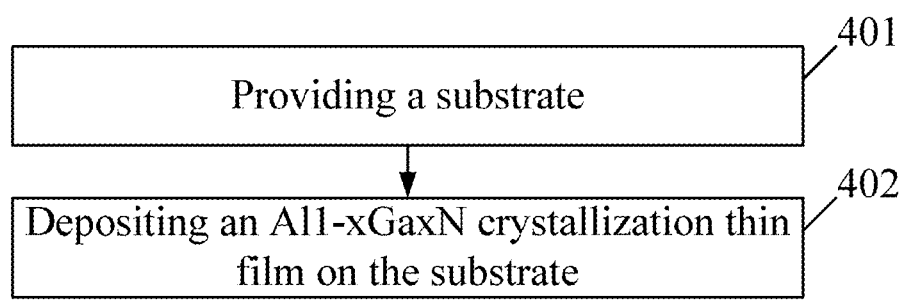
FIG. 4 is a flowchart of a method for preparing an AlGaN template according to a third embodiment of the disclosure.

FIG. 4 shows a method for preparing an AlGaN template according to a third embodiment of the disclosure, which is suitable for the AlGaN template provided by the first embodiment or the second embodiment. As shown in FIG. 4, the method comprises the following steps.

Step 401: a substrate is provided.

The substrate can be a Si, SiC, sapphire, ZnO, GaAs, GaP, MgO, Cu, W, or $SiO_2$ substrate. Preferably, the substrate is a sapphire substrate.

Step 402: an $Al_{1-x}Ga_xN$ crystallization thin film is deposited on the substrate, 0<x<1.

Taking the $Al_{1-x}Ga_xN$ crystallization thin film depositing on a substrate by an electron beam evaporation process as an example, a deposition process of the $Al_{1-x}Ga_xN$ crystallization thin film will be described. The deposition process comprises step 4021 and step 4022.

Step 4021: the substrate is disposed into a nitrogen atmosphere or a nitrogen ion beam stream.

First, the substrate sheet is mounted on a plating pan, and then the plating pan is loaded into an evaporation chamber of an electron beam evaporator. Next, the evacuation chamber is evacuated until it is below $10^{-6}$ Torr, and the evacuation is continued for 10 minutes to reduce other evaporation chamber residues while heating the evacuation chamber to the deposition target temperature. The deposition target temperature may be 100-400 degrees Celsius, preferably 300 degrees Celsius. Then, $N_2$ is introduced into the evaporation chamber, and the partial pressure of $N_2$ was maintained at $2\times10^{-5}$-$7\times10^{-5}$ Torr. The flow rate of $N_2$ may be 2-100 sccm, preferably 30 sccm. After entering $N_2$, it can be stable for 1-3 minutes. Alternatively, an N ion source may be used as the N source, and the power of the ion source may be 1-5 kW.

It should be noted that if the $Al_{1-x}Ga_xN$ crystallization thin film is doped with oxygen, step 4021 comprises: the substrate is disposed in an atmosphere mixed with nitrogen and oxygen (oxygen may be replaced by an oxygen-containing gas), or in a nitrogen ion beam and oxygen ion beam.

Step 4022: an Al source and a Ga source are vaporized by an electron beam in the nitrogen atmosphere or the nitrogen ion beam to deposit an $Al_{1-x}Ga_xN$ crystallization thin film on the substrate. The deposition pressure is $2\times10^{-5}$ to $7\times10^{-5}$ Torr. The deposition temperature is 100 to 400 degrees Celsius. And the deposition time is 10 seconds to 1000 seconds.

Before the electron beam is used to vaporize the Al source and the Ga source, the surface impurities of the Al source and the Ga source may be first removed. Specifically, the plating pan is first rotated, and then the electron gun is turned on to generate an electron beam. When the power of the electron gun slowly rises to about 20% of the total power, the power source is stabilized for about 2 minutes to remove the surface impurities of the metal source in the crucible.

After removing the surface impurities from the metal source in the crucible, the evaporation baffle (for isolating of the pan and crucible) in the evaporation chamber is opened. At the same time, the evaporation rate is stabilized at 2 A/s (2 A/s can be a rate control mode, and the rate control mode will automatically control the beam output power). At this time, electron atoms evaporated by the electron beam are deposited on the substrate and form a metal nitride AlGaN with the reaction gas $N_2$. By controlling the evaporation time of the electron beams alternating between the Al source and the Ga source, a proportion of Ga atoms incorporated in the $Al_{1-x}Ga_xN$ crystallization thin film can be adjusted. For example, the Al source and the Ga source are alternately evaporated for 0.9 s and 0.1 s, respectively, an AlGaN film with Ga:Al=1:9 can be obtained. Here, the deposition time is determined by a desired thickness of the film. For example, a desired total deposition thickness is 30 nm. The electron beam evaporation machine is equipped with a device that automatically monitors the deposition thickness (usually a crystal). A thickness of 30 nm can be set before deposition. When the device monitors the $Al_{1-x}Ga_xN$ crystallization thin film to reach the set thickness (approximately 150 s needed to deposit the film having a thickness of 30 nm), the evaporation baffle of the electron beam evaporation machine will automatically shut off to isolate the substrate and the metal atoms evaporated by the electron beam.

After the evaporation baffle is closed, the electron gun power is gradually reduced to 0, the electron gun power is turned off. And the deposition chamber temperature is lowered. When the temperature is below 50 degrees, the vacuum begins to break. When the vacuum of the deposit chamber reaches 1 atmosphere, the deposition chamber is opened and the pan and the substrate sheets are taken out. The desired AlGaN template is obtained.

Then, taking the $Al_{1-x}Ga_xN$ crystallization thin film depositing on a substrate by a PVD process as an example, the deposition process of an $Al_{1-x}Ga_xN$ crystallization thin film is described. The deposition process comprises step 4023 and step 4024.

Step 4023: the substrate is arranged in a vacuum environment and the substrate is baked. The baking time is 1 to 15 minutes, the baking temperature is 300 to 900 degrees Celsius, and the baking pressure is less than $10^{-7}$ Torr.

First, the substrate is placed on a tray of SiC material, and the tray is placed into a PVD sputtering machine and then conveyed to a deposition chamber. Next, after the substrate is placed into the deposition chamber, the deposition chamber is evacuated, and the substrate is heated while evacuating. When the base pressure is drawn below $10^{-7}$ Torr, the heating temperature is stabilized at 300-900 degrees Celsius to bake the substrate. The baking time is 1-15 minutes.

Step 4024: after baking, the aluminum-germanium alloy target is sputtered in a gas atmosphere in which at least Ar and $N_2$ are mixed to deposit an $Al_{1-x}Ga_xN$ crystallization thin film on the substrate. The deposition temperature is 400 degrees Celsius to 800 degrees Celsius, the deposition pressure is 1 mTorr to 10 mTorr, the sputtering power is 1 kW to 10 kW, and the sputtering time is 10 seconds to 1000 seconds.

The sputtering time is the deposition time of the $Al_{1-x}Ga_xN$ film. The sputtering power and the sputtering time affect the thickness of the $Al_{1-x}Ga_xN$ film. When the sputtering power is 1 kW to 10 kW and the sputtering time is 10 seconds to 1000 seconds, the $Al_{1-x}Ga_xN$ film has a thickness of 1 to 1000 nm.

In the embodiment, the flow ratio of Ar to $N_2$ may be 1:3 to 1:10.

In the embodiment, the Ga content of the deposited $Al_{1-x}Ga_xN$ thin film can be controlled by adjusting the ratio of Al and Ga components in the AlGaN alloy target, sputtering power, sputtering atmosphere Ar/N ratio, and sputtering pressure. For example, an AlGa alloy target with a Ga content of 20% can be used to prepare an $Al_{1-x}Ga_xN$ template with a Ga content of 15%-25%. If the Ar/N sputtering gas ratio is set to 1:5, the deposition pressure is 4.0 mTorr, and the sputtering power is 2 kW, the $Al_{1-x}Ga_xN$ template with a Ga content of 20% can be obtained. By adjusting the sputtering process, the Ga content in the $Al_{1-x}Ga_xN$ template can be varied. For example, if the deposition pressure is increased (decreased), the Ga content in the $Al_{1-x}Ga_xN$ template will increase (decrease).

As an alternative embodiment, the $Al_{1-x}Ga_xN$ crystallization thin film comprises a first AlGaN layer deposited on a substrate, and the first AlGaN layer is doped with oxygen. Step 4024 comprises: after baking, an aluminum gallium alloy target is sputtered in a gas atmosphere in which Ar, $N_2$, and $O_2$ are mixed, or a gas atmosphere in which Ar, $N_2$, and an oxygen-containing gas are mixed to deposit the $Al_{1-x}Ga_xN$ crystallization thin film on the substrate.

Specifically, Ar, $N_2$, and $O_2$ ($O_2$ may be replaced by an oxygen-containing gas) are introduced. The flow rate of the $O_2$ introduced may be 10% of the sum of the flow rates of Ar and $N_2$. During the deposition process, it is preferably that the total gas flow rate of Ar, $N_2$, and $O_2$ can maintain the PVD deposition chamber pressure at 1 to 10 mTorr. At the same time, the substrate heating temperature is set to the deposition temperature, and the preferable deposition temperature range is between 400 and 800 degrees Celsius. After the deposition temperature is stabilized for 10 to 60 seconds, a sputtering power source is turned on to sputter the aluminum-germanium alloy target, and an $Al_{1-x}Ga_xN$ crystallization thin film doped with oxygen is deposited on the substrate. Here, the sputtering power may be set to 1 kW to 10 kW depending on the deposition rate requirement. The sputtering time is set to 10 seconds to 1000 seconds depending on the thickness of the $Al_{1-x}Ga_xN$ crystallization thin film.

During the deposition of the $Al_{1-x}Ga_xN$ crystallization thin film, the flow rate of the $O_2$ introduced can be varied. For example, gradually increase or decrease the flow rate of the $O_2$ introduced. The variation manner of the flow rate of the $O_2$ introduced may be continuously increasing or continuously decreasing, such as linearly increasing and linearly decreasing, so that the oxygen content in the deposited $Al_{1-x}Ga_xN$ film continuously changes. The variation manner may also be increasing at intervals or decreasing at intervals, such as increasing in steps and decreasing in steps, so that the deposited $Al_{1-x}Ga_xN$ film has a laminated structure, and the content of oxygen in the $Al_{1-x}Ga_xN$ film varies in intervals. The variation manner can also be a combination of the continuous change manner and the interval change manner.

Preferably, the content of oxygen in the first AlGaN layer gradually increases or decreases from the interface between the first AlGaN layer and the substrate to the surface of the first AlGaN layer. Then, step 4024 further comprises gradually increasing or decreasing the flow rate of $O_2$ passing through during deposition of the $Al_{1-x}Ga_xN$ crystallization thin film.

Assuming that the content of oxygen in the deposited first AlGaN layer is step-wisely increased from the interface of the substrate/first AlGaN layer to the surface of the first AlGaN layer, the first AlGaN layer may be divided into 5 to 10 layers to growth when the first AlGaN layer is deposited. The oxygen is uniformly distributed in each layer. The oxygen content in the 5 to 10 layers gradually changes layer by layer. Taking the first AlGaN layer comprising 6 AlGaN sublayers as an example, when depositing the first AlGaN layer, the sputtering power of the AlGaN alloy target can be set to 3 kW. The deposition time of each AlGaN sublayer is set to 10 seconds from the first AlGaN sublayer to the sixth AlGaN sublayer so that the deposition thickness of each AlGaN sublayer is about 4 nm. In addition, when the first AlGaN sublayer is grown, the flow rate of $O_2$ introduced is 0.5% of the sum of the flow rate of Ar and $N_2$. And when the second to sixth AlGaN sublayers are grown, the flow rate of $O_2$ introduced is sequentially adjusted to 1%, 3%, 5%, 10%, 15% of the sum of the flow rate of Ar and $N_2$. In this way, an AlGaN template with a total thickness of 24 nm and having an oxygen doping amount gradually changing layer by layer is obtained.

Assuming that the content of oxygen in the deposited first AlGaN layer linearly increases from the interface of the substrate/first AlGaN layer to the surface of the first AlGaN layer, then the flow rate of the oxygen or the oxygen-containing gas can be linearly increased when the first AlGaN layer is deposited. For example, during the deposition process of the first AlGaN layer, the sputtering power of the AlGaN alloy target can be set to 2 kW, and the sputtering time is 100 seconds. At this time, the thickness of the first AlGaN layer is about 25 nm. At the same time, within the 100 seconds, the flow rate of $O_2$ is linearly increased from 10% of the sum of the flow rates of Ar and $N_2$ to 12% of the sum of the flow rates of Ar and $N_2$.

Optionally, the $Al_{1-x}Ga_xN$ crystallization thin film further comprises a second AlGaN layer deposited on the first AlGaN layer. The second AlGaN layer is doped with oxygen and the oxygen in the second AlGaN layer is evenly distributed. The thickness of the second AlGaN layer is greater than 1 nm. Preferably, the thickness of the second AlGaN layer is 3 to 5 nm. Then, step 4024 further comprises: when the deposition process has passed a specified length of time and the deposition has not been completed, the flow rate of $O_2$ or oxygen-containing gas introduced at the current time is adjusted to the designated flow rate until the deposition is completed.

Preferably, when the content of oxygen in the first AlGaN layer gradually decreases from the interface between the first AlGaN layer and the substrate to the surface of the first AlGaN layer, the specified flow rate is not greater than the $O_2$ or the oxygen-containing gas introduced in the specified period such that the content of oxygen gradually decreases from the first AlGaN layer to the second AlGaN layer. When the content of oxygen in the first AlGaN layer gradually increases from the interface between the first AlGaN layer and the substrate to the surface of the first AlGaN layer, the specified flow rate is not less than the flow rate of the $O_2$ or oxygen-containing gas introduced in the specified period such that the content of oxygen gradually increases from the first AlGaN layer to the second AlGaN layer.

For example, assuming that the entire deposition process is maintained for 300 seconds (sputtering time), the specified duration is 285 seconds; the sputtering power is 4 kW, and the initial flow rate of $O_2$ is 0.2% of the sum of the flow rates of Ar and $N_2$. In the first 285 seconds, the flow rate $O_2$ is linearly decreased from 12% to 10% of the sum of the flow rates of Ar and $N_2$. And within the next 15 seconds, the flow rate of $O_2$ is maintained at 10% of the sum of the flow rates of Ar and $N_2$ and continues to sputter for 15 seconds to obtain an AlGaN template.

The second AlGaN layer can ensure that the stress state of the surface layer of the AlGaN template can be maintained as stable and consistent as possible. It ensures that the stress of AlGaN templates produced from different batches is stable and controllable, and is conducive to the stabilization of stress in the subsequent GaN epitaxial layers in batch production, thereby maximizing the stable control of wavelength uniformity in batch growth.

After the deposition is completed, the tray is passed out of the PVD deposition chamber. After the sample is cooled, the desired AlGaN template is obtained.

Figure 5:
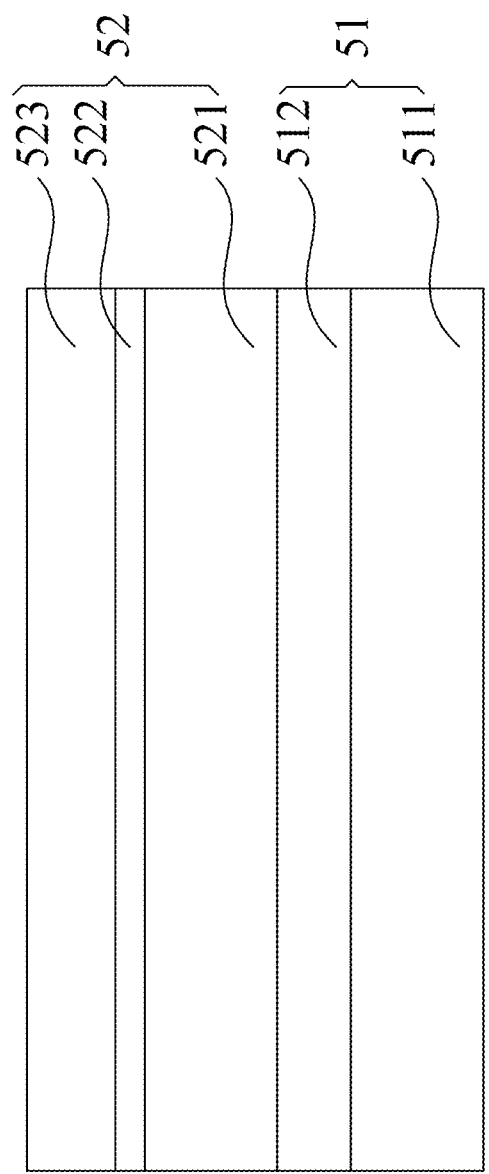
FIG. 5 is a schematic structural view of a semiconductor device comprising an AlGaN template according to a fourth embodiment of the disclosure.

FIG. 5 shows a semiconductor device comprising an AlGaN template according to a fourth embodiment of the disclosure. As shown in FIG. 5, the semiconductor device comprises a template 51 and a nitride semiconductor layer 52. Here, the template comprises a substrate 511 and an $Al_{1-x}Ga_xN$ crystallization thin film 512 deposited on the substrate, and the nitride semiconductor layer 52 is deposited on the $Al_{1-x}Ga_xN$ crystallization thin film 512, where $0<x<1$.

The template 51 may be the AlGaN template provided in the first embodiment or the second embodiment, which will not be described herein. The method for preparing the AlGaN template 51 can be referred to the third embodiment.

In the embodiment, the nitride semiconductor layer 52 may comprise a single or multiple n-type nitride layers 521, a single or multiple nitride multiple quantum well active layers 522, and a single or multiple p-type nitride layers 523 and a nitride contact layer (not shown) stacked on the $Al_{1-x}Ga_xN$ crystallization thin film 512 in sequence. Here, the quantum barrier layer in the nitride multiple quantum well active layer 522 comprises In. The p-type nitride layer 523 comprises one or more electron blocking layers comprising Al. And the nitride contact layer comprises n-type and p-type nitride contact layer. The n-type nitride contact layer is used for forming an n-electrode and disposed on the single or multiple n-type nitride layers 521. The p-type nitride contact layer is used for forming a p-electrode and disposed on the single or multiple p-type nitride layers 523.

Alternatively, the nitride semiconductor layer 52 may be a GaN-based LED epitaxial layer. Preferably, the GaN-based LED epitaxial layer comprises a first high-temperature GaN layer, a second high-temperature GaN layer, an n-type GaN layer, a multiple quantum well active layer, a p-type AlGaN electron blocking layer, a p-type GaN layer and a p-type InGaN contact layer sequentially stacked on the $Al_{1-x}Ga_xN$ crystallization thin film 512.

When being realized, the GaN-based LED epitaxial layer can be grown by a metal-organic chemical vapor deposition (MOCVD) process.

Specifically, the first high temperature GaN layer has a growth temperature of 950 to 1050 degrees Celsius, preferably 1000 degrees Celsius, and a growth pressure of 50 to 600 Torr. The thickness of the first high temperature GaN layer is 0.5 to 3 microns.

The second-high temperature GaN layer has a growth temperature of 1020-1100 degrees Celsius, preferably 1060 degrees Celsius, and a growth pressure of 50-600 Torr. The second-high temperature GaN layer has a thickness of 0.2-3 microns. Here, the second high-temperature GaN layer may not be doped with Si or lightly doped with Si. When Si is doped, the doping concentration of Si is $0-2\times10^{18}$ cm$^{-3}$, and the preferable doping concentration of Si is $8\times10^{17}$ cm$^{-3}$.

The n-type GaN layer has a growth temperature of 1020-1100 degrees Celsius, preferably 1060 degrees Celsius, a growth pressure of 50-600 Torr. The n-type GaN layer has a thickness of 0.5-3 microns. The n-type is realized by doping Si. The doping concentration of Si is $2\times10^{18}$-$5\times10^{19}$ cm$^{-3}$, and the preferable doping concentration of Si is $1\times10^{19}$ cm$^{-3}$.

In the multi-quantum well active layer, the quantum well is an InGaN quantum well. The In content can be controlled from 1% to 30% depending on the wavelength requirements. For example, the In content is controlled at 3% for a violet LED with a wavelength of 390 nm, the In content is controlled at 13% for a blue LED with a wavelength of 450 nm, and the In content is controlled at 20% for a green LED with a wavelength of 520 nm. The quantum well has a thickness of 1 to 5 nm, and preferably the quantum well has a thickness of 3 nm. The material of the quantum barrier is AlGaN, and the Al content can be controlled from 0 to 30%. The thickness of the quantum barrier is 3 to 50 nm, and the preferred thickness of the quantum barrier is 12 nm. The number of pairs of quantum wells is 1 to 20, preferably 10 pairs of quantum wells.

The p-type AlGaN electron blocking layer has a growth temperature of 800 to 950 degrees Celsius. The Al content can be controlled at 10% to 30%. The thickness of the p-type AlGaN electron blocking layer is 10 to 50 nm, and the preferable thickness of the p-type AlGaN electron blocking layer is 25 nm. The p-type is realized by doping with Mg, and the doping concentration of Mg is $1\times10^{18}$-$1\times10^{20}$ cm$^{-3}$.

The growth temperature of the P-type GaN layer is 800 to 950 degrees Celsius. The thickness of the P-type GaN layer is 20 to 500 nm, and the thickness of the P-type GaN layer preferably is 70 nm. The p-type is realized by doping with Mg, and the doping concentration of Mg is $1\times10^{18}$-$1\times10^{20}$ cm$^{-3}$.

In the P-type InGaN contact layer, the In content can be controlled from 0 to 20%. The thickness of the P-type InGaN contact layer is from 0.5 to 10 nm. The p-type is realized by doping with Mg, and the P-type doping concentration is higher so as to facilitate the subsequent chip processing to form an ohmic contact. The doping concentration of Mg is $5\times10^{19}$-$1\times10^{22}$ cm$^{-3}$.

Figure 6A:
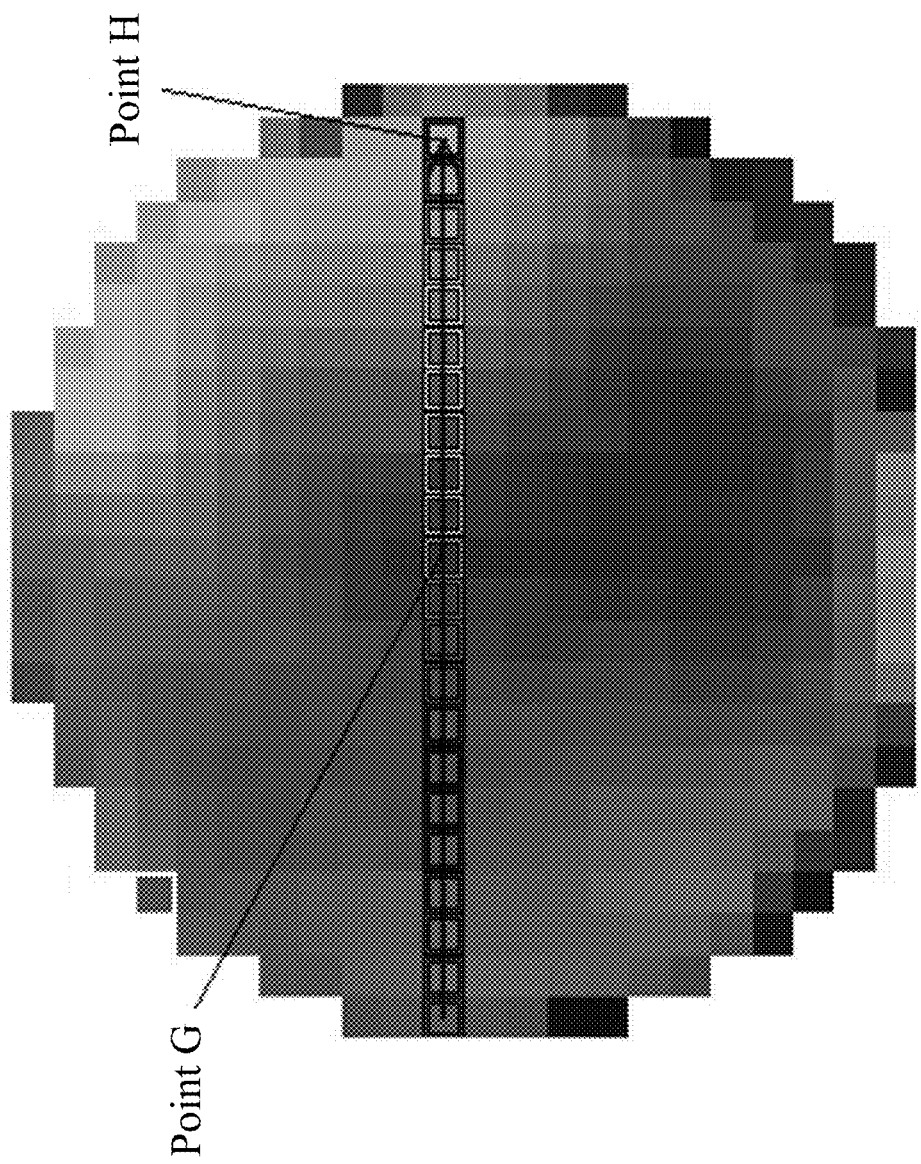
FIGS. 6A-6B illustrate a PL wavelength mapping diagram of a 4-inch LED epitaxial wafer provided by a fourth embodiment of the disclosure.
Figure 6B:
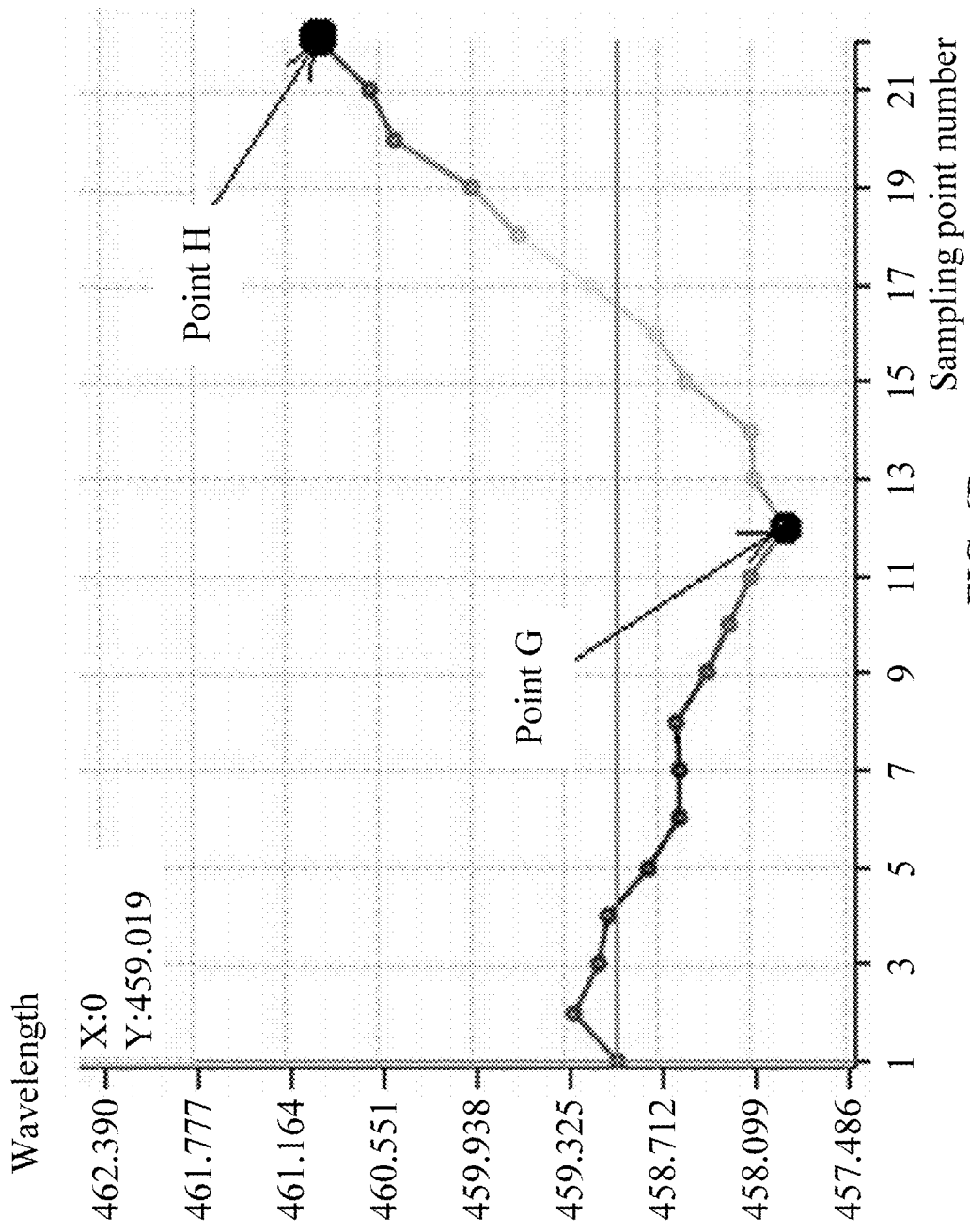

In implementation, a 4-inch or 6-inch AlGaN template can be prepared by the method provided in the third embodiment. Then the GaN-based LED epitaxial layer can be grown on the 4-inch or 6-inch AlGaN template by using the MOCVD process described above to obtain a 4-inch or 6-inch LED epitaxial wafers. FIGS. 6A-6B show a PL wavelength mapping of a 4-inch LED epitaxial wafer. As can be seen from FIGS. 6A-6B, the center (G-point) wavelength of the epitaxial wafer is 458 nm, and the edge (H-point) wavelength of the epitaxial wafer is 461 nm. The difference between the center and edge wavelengths is 3 nm. The standard deviation of the wavelength of the entire sheet is 1.35 nm. Compared with LED epitaxial wafers prepared based on the existing AlGaN template (standard deviation of the wavelength is 4.18 nm), the standard deviation of the wavelength is reduced by approximately 3 nm. The wavelength uniformity is fundamentally improved.

Unless otherwise indicated, the numerical ranges involved include the beginning and end values. It will be obvious to those skilled in the art that changes and modifications may be made, and therefore, the aim in the appended claims is to cover all such changes and modifications.

What is claimed is:

1. An AlGaN template, comprising a substrate and an $Al_{1-x}Ga_xN$ crystallization thin film deposited on the substrate, wherein
   $0<x<1$;
   the $Al_{1-x}Ga_xN$ crystallization thin film comprises an AlGaN layer deposited on the substrate, and the AlGaN layer is doped with oxygen; and
   a content of oxygen in the first AlGaN layer gradually decreases or gradually increases from an interface between the substrate and the first AlGaN layer to a surface of the first AlGaN layer.

2. The AlGaN template of claim 1, wherein the $Al_{1-x}Ga_xN$ crystallization thin film has a thickness of from 1 nm to 1000 nm.

3. The AlGaN template of claim 1, wherein the substrate is a Si, SiC, sapphire, ZnO, GaAs, GaP, MgO, Cu, W, or $SiO_2$ substrate.

4. A semiconductor device comprising the AlGaN template of claim 1 and a nitride semiconductor layer deposited on the $Al_{1-x}Ga_xN$ crystallization thin film of the AlGaN template.

5. An AlGaN template, comprising a substrate and an $Al_{1-x}Ga_xN$ crystallization thin film deposited on the substrate, wherein
   $0<x<1$;
   the $Al_{1-x}Ga_xN$ crystallization thin film comprises a first AlGaN layer deposited on the substrate, and the first AlGaN layer is doped with oxygen; and
   the $Al_{1-x}Ga_xN$ crystallization thin film further comprises a second AlGaN layer deposited on the first AlGaN layer, the second AlGaN layer is doped with oxygen and the oxygen doped in the second AlGaN layer is uniformly distributed in the second AlGaN layer, and a thickness of the second AlGaN layer is greater than 1 nm.

* * * * *